(12) United States Patent
Seshan

(10) Patent No.: US 6,480,385 B2
(45) Date of Patent: Nov. 12, 2002

(54) ELECTRONIC ASSEMBLY AND COOLING THEREOF

(75) Inventor: Krishna Seshan, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/012,994

(22) Filed: Dec. 10, 2001

(65) Prior Publication Data

US 2002/0048153 A1 Apr. 25, 2002

Related U.S. Application Data

(63) Continuation-in-part of application No. 09/660,859, filed on Sep. 13, 2000.

(51) Int. Cl.[7] .................................................. H05K 7/20
(52) U.S. Cl. ...................... 361/704; 361/705; 361/717; 361/718; 361/722; 361/699; 257/620; 257/706; 257/707; 257/714; 257/712
(58) Field of Search ................................. 361/704, 705, 361/706, 707, 714, 717–719, 722, 723; 257/675, 684, 620, 637, 706, 712, 758

(56) References Cited

U.S. PATENT DOCUMENTS

| | | | | |
|---|---|---|---|---|
| 4,924,291 A | * | 5/1990 | Lesk et al. | 257/669 |
| 5,089,427 A | * | 2/1992 | Schoenberg | 148/DIG. 174 |
| 5,270,256 A | | 12/1993 | Bost et al. | 437/195 |
| 5,757,060 A | | 5/1998 | Lee et al. | 257/529 |
| 5,757,072 A | | 5/1998 | Gorowitz et al. | 257/700 |
| 6,043,551 A | * | 3/2000 | Seshan | 257/452 |
| 6,163,065 A | * | 12/2000 | Seshan et al. | 257/508 |
| 6,211,554 B1 | * | 4/2001 | Whitney | 257/355 |
| 6,284,570 B1 | * | 9/2001 | Betran et al. | 438/111 |

* cited by examiner

Primary Examiner—Boris Chervinsky
(74) Attorney, Agent, or Firm—Schwegman, Lundberg, Woessner & Kluth, P.A.

(57) ABSTRACT

An integrated circuit that includes a die having a circuit area and outer edges. A guard ring surrounds the circuit area within the outer edges of the die. The guard ring includes a projection that extends to at least one outer edge of the die to extract heat from the die that is generated during operation of the integrated circuit.

18 Claims, 11 Drawing Sheets

ELECTRONIC ASSEMBLY AND COOLING THEREOF

CROSS-REFERENCE TO RELATED APPLICATIONS

This application is a continuation-in-part application of co-pending U.S. patent application Ser. No. 09/660,859, filed Sep. 13, 2000, entitled "An Electronic Assembly and Cooling Thereof" which is assigned to the same assignee as the present application.

BACKGROUND OF THE INVENTION

1). Field of the Invention

This invention relates to an electronic assembly and cooling thereof.

2). Discussion of Related Art

Integrated electronic circuits are often formed in semiconductor dies. Such a die is mounted and electrically connected to a package substrate which is then mounted to an electronic substrate such as a motherboard. The package substrate is also electrically connected to the motherboard. Electric signals can be transmitted between metal lines in the motherboard and the electronic circuit so that the electronic circuit is operated.

Operation of the electronic circuit causes heating of the semiconductor die. The electronic circuit may be damaged when the die heats up too much and it may therefore be required to cool the die. The die is typically cooled by mounting a heat sink to the die. Heat can then be transferred from the die to the heat sink and be convected from fins of the heat sink. Alternatively, a fan may be mounted over the die and the fan may blow air onto the die so as to cool the die. A heat sink or a fan increases transfer of heat from a surface of the die opposing the package substrate and the motherboard.

During the manufacture and operation of an electronic assembly that includes an integrated circuit, the die may be subjected to mechanical stresses that can adversely effect any active devices, passive devices, and interconnects that make up the integrated circuit. One example of subjecting the die to stress occurs during bonding, such as flip-chip bonding, of the die to a substrate. The die and substrate are exposed to heat that causes the substrate and die to expand. If the die and the substrate have different coefficients of thermal expansion, then the die and substrate expand at different rates, generating stress on the die. When the die is stressed, any active devices, passive devices, and interconnects formed on the die are also stressed to the point where a mechanical failure can occur in any of the components that make up the die.

One common type of mechanical failure is the shearing of interconnects within the die. Interconnects typically connect devices together in the integrated circuit such that shearing the connections between devices causes catastrophic failure of the integrated circuit.

These types of failures should become even more prevalent in new integrated circuits because next generation processors are likely to include interconnects fabricated from high conductivity materials, such as copper, that are embedded in low strength dielectric materials, such as low-K materials. The low strength dielectric materials in these types of integrated circuits will be highly vulnerable to catastrophic failures such as interconnect shearing.

FIG. 5 is a perspective view of a prior art integrated circuit 1 that includes a die 3 and a guard ring structure 5. Die 3 includes a circuit area 7 and outer edges 9 such that guard ring structure 5 separates outer edges 9 from circuit area 7. Circuit area 7 is located within guard ring structure 5 and is encircled by guard ring structure 5. The guard ring structure 5 on prior art dies 3 does not extend into the area of die 3 that is proximate to outer edges 9. Conventional guard ring structures 5 only relieve mechanical stress in the die 3.

Die 3 is typically fabricated from a semiconductor that has an integrated circuit formed thereon. The integrated circuit 1 typically includes active devices (e.g., diodes and transistors), passive devices (e.g., resistors and capacitors) and interconnects that are formed in circuit area 7. The formation of devices in circuit area 7 includes the formation of devices and interconnects that are diffused, implanted, deposited, or otherwise formed within or above the substrate.

FIG. 6 is a top view of a wafer 8 having at least one prior art die 3 formed thereon. During the manufacture of die 3, wafer 8 is partitioned and sliced into a number of pieces known as dice. Dicing includes slicing wafer 8 along lines 10 that are aligned with outer edges 9 of die 3 to separate die 3 from wafer 8. As wafer 8 is diced, the outer edges 9 of die 3 are mechanically stressed. This stress can create cracks in the outer edges 9 of die 3 that could damage the electronic devices or interconnects on die 3 if the cracks expand into circuit area 7.

Circuit area 7 is fabricated away from outer edges 9 to avoid damage from cracks. In addition, the guard ring structure 5 that encircles circuit area 7 prevents cracks from propagating into circuit area 7. Guard ring structure 5 does not promote heat dissipation.

Therefore, any developments to existing electronic assemblies that (i) increase the ability of electronic assemblies to dissipate thermal energy; and (ii) reduce the potential for damage to integrated circuits caused by cracking due to stress would be desirable.

BRIEF DESCRIPTION OF THE DRAWINGS

The invention is further described by way of examples with reference to the accompanying drawings wherein.

DETAILED DESCRIPTION OF THE INVENTION

Figure 1:
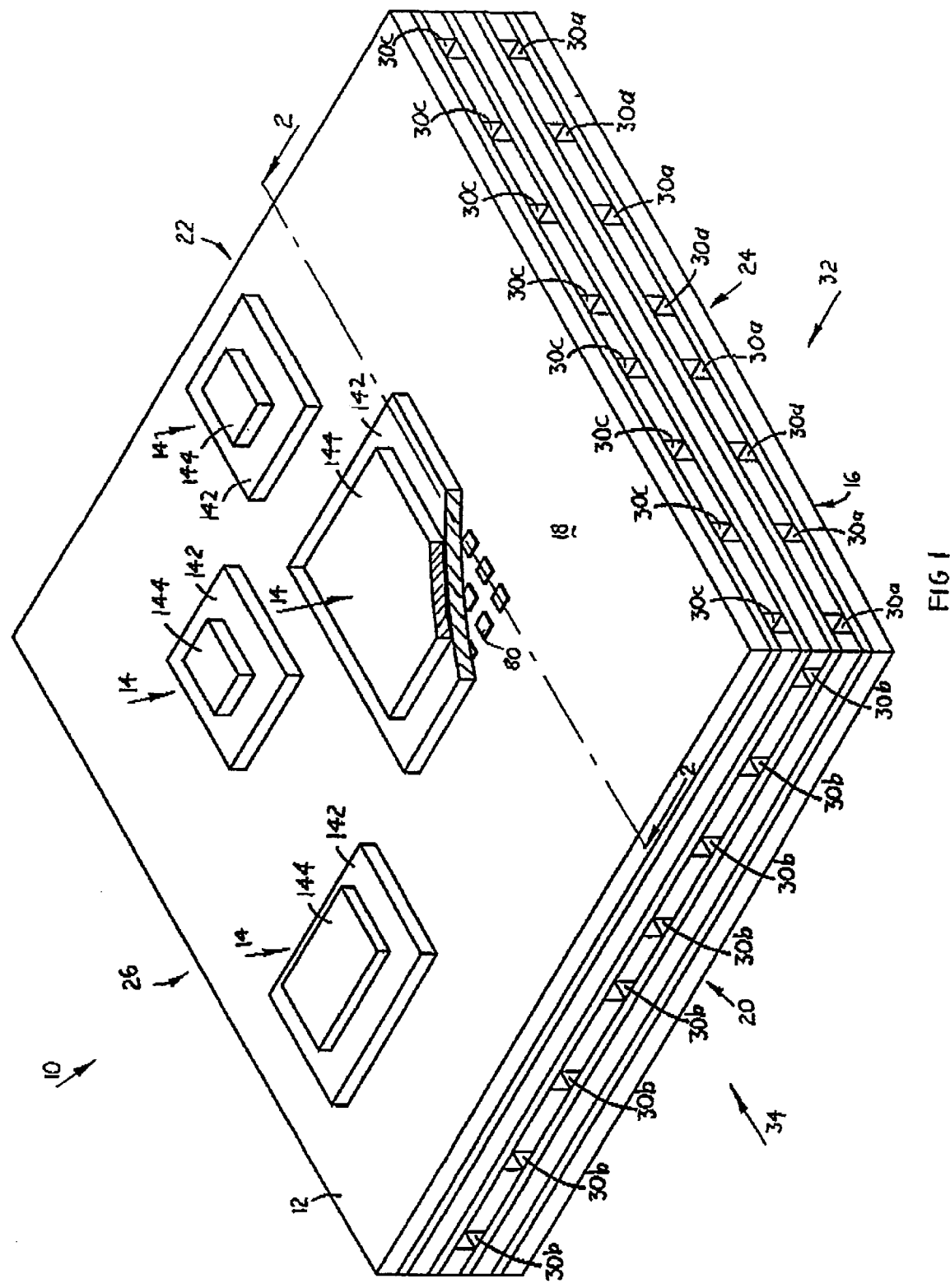
FIG. 1 is a perspective view of an electronic assembly according to one embodiment of the invention.

FIG. 1 of the accompanying drawings illustrates an electronic assembly 10 according to an embodiment of the invention, including an electronic substrate in the form of a computer motherboard 12, and a number of semiconductor assemblies 14 mounted to the motherboard 12.

The motherboard 12 has lower and upper opposing major surfaces 16 and 18 respectively, two opposing side surfaces 20 and 22 respectively, and two opposing end surfaces 24 and 26 respectively. Each side surface or end surface 20, 22, 24, or 26 extends from a respective edge of the lower surface 16 to a respective edge of the upper surface 18.

A plurality of cooling openings 30 are formed in the motherboard 12. Each cooling opening 30 extends parallel to the lower surface 16 and the upper surface 18 in a plane in which the motherboard 12 extends. The cooling openings 30 include a first plurality of cooling openings 30a, a second plurality of cooling openings 30b, and a third plurality of cooling openings 30c.

The first plurality of cooling openings 30a are located in a common plane and extend in a common direction 32 into the end surface 24, through the motherboard 12, and out of the end surface 26. The second plurality of cooling openings 30b are located in a common plane which is above the plane of the cooling openings 30a and extend in a common direction 34 into the side surface 20, through the motherboard 12 and out of the side surface 22. The third plurality of cooling openings 30c are located in a common plane above the plane of the cooling openings 30b and extend in the direction 32 into the end surface 24, through the motherboard 12 and out of the end surface 26.

Figure 2:
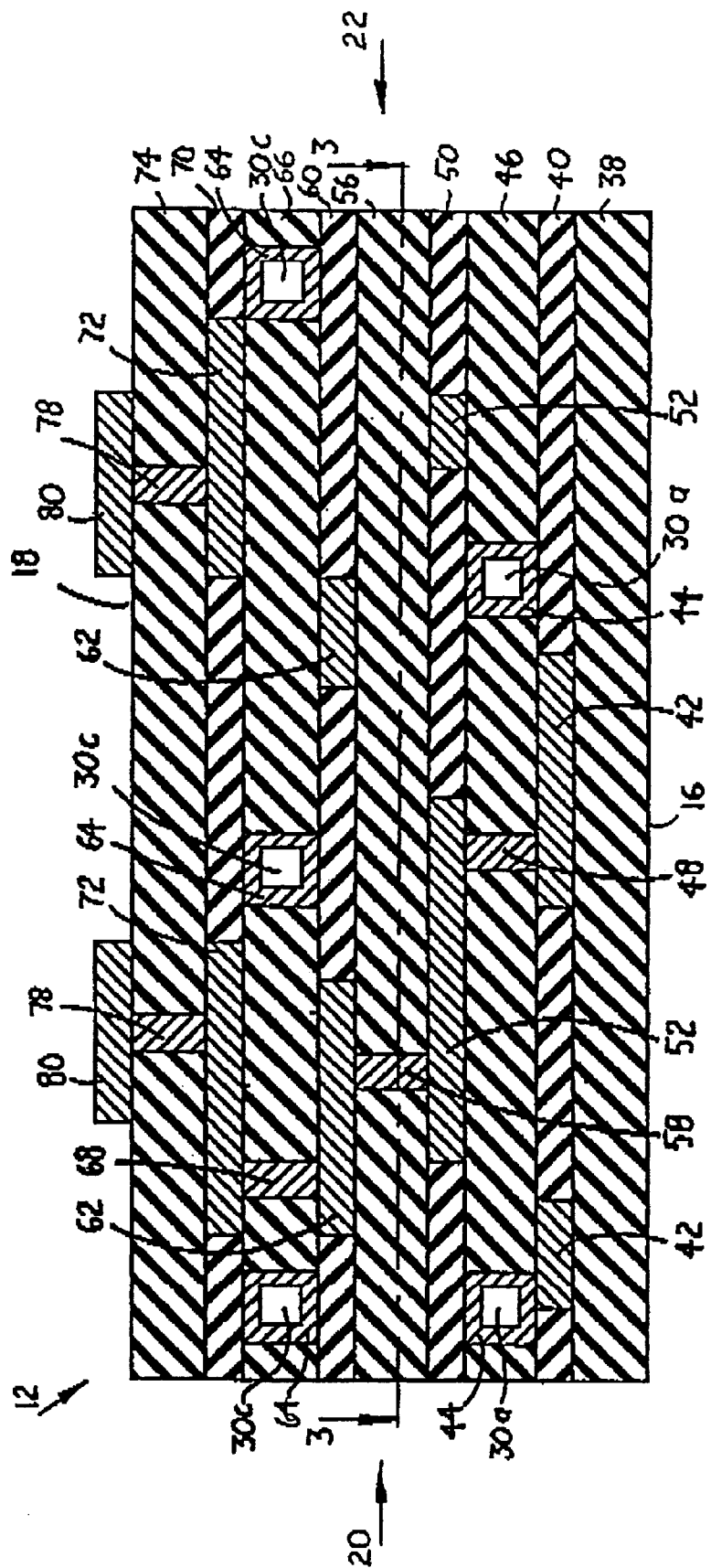
FIG. 2 is a cross-sectional view on 2—2 in FIG. 1 of a motherboard forming part of the electronic assembly.

FIG. 2 is a cross sectional view on 2—2 in FIG. 2 of the motherboard 12. A base layer 38 of insulating material is provided onto which a dielectric material layer 40 is formed. Metal lines 42 are formed within the dielectric material layer 40. Capillaries 44 are located on a plane or surface formed by of the dielectric material layer 40 and metal lines 42. Each capillary 44 defines a respective one of the cooling openings 30a. Each cooling opening 30a is entirely bounded by a respective capillary 44. The capillaries 44 are preferably made of a metal or other thermally conductive material. An interlayer dielectric material layer 46 is formed next to the capillaries 44. Metal vias 48 are formed into the interlayer dielectric material layer 46. Each via 48 has a lower end which is in contact with one of the metal lines 42.

A dielectric material layer 50 is formed on a surface provided by the interlayer dielectric material 46, the capillaries 44, and upper ends of the vias 48. Metal lines 52 are formed in the dielectric material layer 50. A respective metal line 52 may have a portion contacting an upper end of a respective via 48. More capillaries (not shown) are then located on a surface provided by the dielectric material layer 50 and the metal lines 52. These capillaries extend at right angles to the capillaries 44 and each one of these capillaries has a respective one of the cooling openings 30b shown in FIG. 1. An interlayer dielectric material 56 is formed next to these capillaries and vias 58 are formed in the interlayer dielectric material layer 56. A respective one of the vias 58 has a lower portion contacting a respective one of the metal lines 52.

A dielectric material layer 60 is then formed on a surface provided by the interlayer dielectric material layer 56, upper ends of the vias 58, and the capillaries located within the interlayer dielectric material layer 56. Metal lines 62 are then formed within the dielectric material layer 60. A respective metal line 62 may have a respective portion contacting a respective upper end of a respective one of the vias 58. More capillaries 64 are then located on a surface provided by the dielectric material layer 60, and the metal lines 62. Each capillary 64 defines one of the cooling openings 30c and is the same as one of the capillaries 44 in all other respects. An interlayer dielectric material layer 66 is formed next to the capillaries 64 and metal vias 68 are formed into the interlayer dielectric material layer 66. Each via 68 may have a lower end contacting a portion of a respective one of the metal lines 62.

A dielectric material layer 70 is formed on a surface provided by the interlayer dielectric material layer 66, the capillaries 64, and upper ends of the vias 68. Metal lines 72 are formed within the dielectric material layer 70. A respective metal line 72 may have a portion contacting a respective upper end of a respective one of the vias 68.

A top layer 74 of dielectric material is formed on a surface provided by the dielectric material layer 70 and the metal lines 72. Metal vias 78 are formed in the top layer 74. Each via 78 has a lower end contacting a respective one of the metal lines 72. Contact pads 80 are then formed on a surface of the top layer 74 and upper ends of the vias 78. Each contact pad 80 has a portion contacting a respective one of the vias 78. Respective ones of the contact pads 80 can be electrically connected to one another contact pad 80 through a series of vias and metal lines in the motherboard 12.

Figure 3:
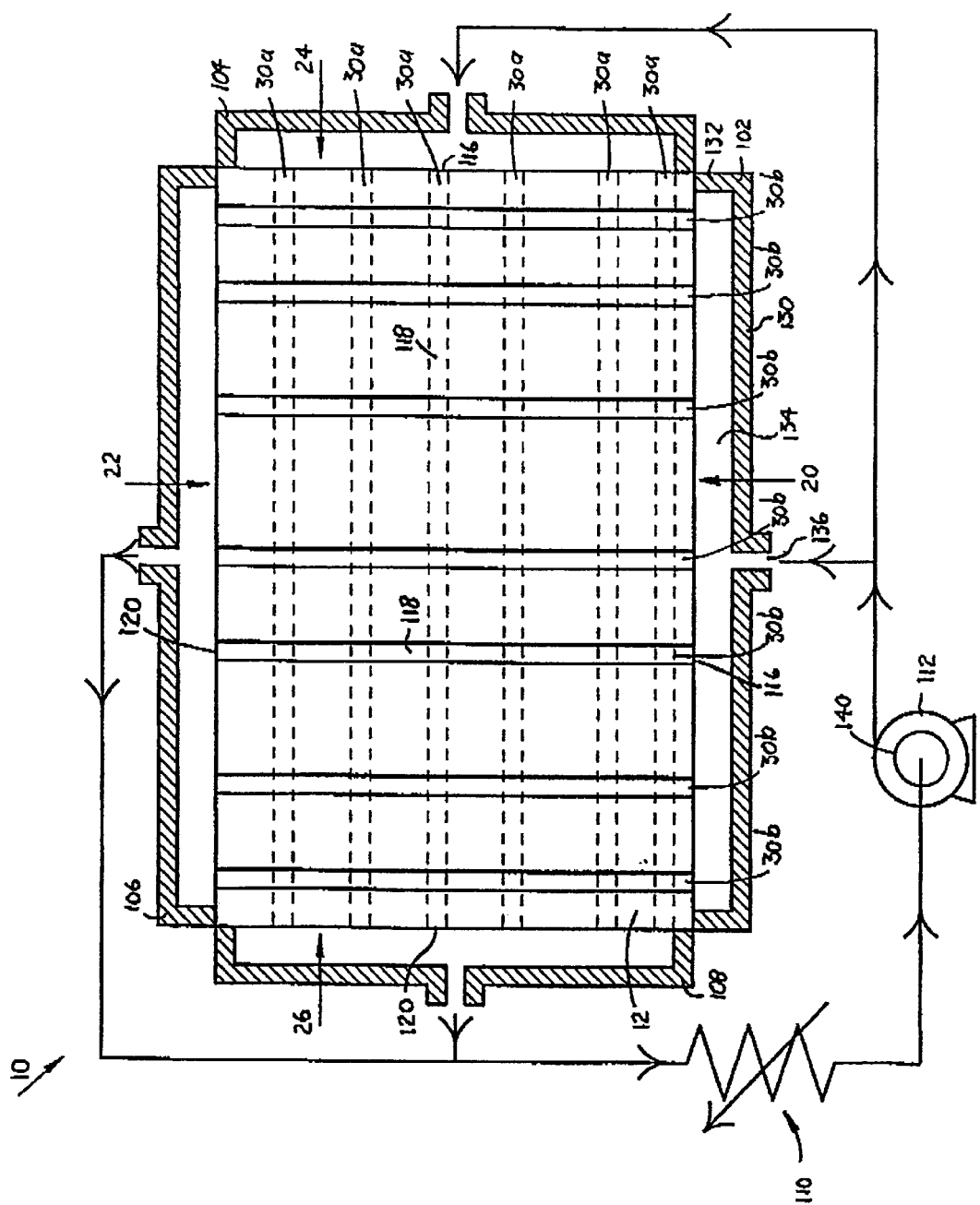
FIG. 3 is a cross-sectional plan view on 3—3 of the motherboard in FIG. 2, further illustrating other components of the electronic assembly.

FIG. 3 is a view on 3—3 in FIG. 2 of the motherboard 12, further illustrating other components of the electronic assembly 10 including an inlet manifold 102, and inlet manifold 104, an outlet manifold 106, an outlet manifold 108, a radiator 110, and a pump 112. Each opening 30a, 30b, or 30c has a respective inlet 116, a respective section 118 extending through the motherboard 12, and a respective outlet 120. An inlet 116 of a cooling opening 30a is located in the end surface 24 and an outlet 120 of a cooling opening 30a is located in the end surface 26. An inlet 116 of an opening 30b is located in the side surface 20 and an outlet 120 of a cooling opening 30b is located in the side surface 22.

The inlet manifold 102 includes a plate portion 130 and flanges 132 extending from edges of the plate portion 130. The plate portion 130 and the flanges 132 together define a recessed shape. The inlet manifold 130 is secured against the side surface 20 so that the side surface 20, the flanges 132 and the plate portion 130 together define an enclosed cavity 134. A port 136 is provided through the plate portion 130.

The inlet manifold 104 and the outlet manifolds 106 and 108 are of similar construction to the inlet manifold 102 and are located over the end surface 24, the side surface 22, and the end surface 26, respectively.

An outlet of the pump 112 is connected to the port 136 of the inlet manifold 132 and a port of the inlet manifold 104. Ports of the outlet manifolds 106 and 108 are connected to the radiator 110. The radiator 110 is connected to an inlet of the pump 112. The electric motor 140 is connected to a shaft (not shown) of the pump 112. Operation of the electric motor 140 rotates a shaft of the pump 112 so that the pump draws a fluid into its inlet and expels the fluid out of its outlet.

Referring again to FIG. 1, each semiconductor assembly 14 includes a respective package substrate 142 and a respective semiconductor die 144 mounted to the package substrate 142. Each semiconductor die 144 is thereby thermally connected to a respective package substrate 142. Each semiconductor die 144 also has an integrated electronic circuit manufactured therein according to conventional methods. The electronic circuit is connected to contacts (not shown) on the package substrate 142. Vias and metal lines, similar to the vias and metal lines of the motherboard 12 are formed in the package substrate 142. Electric contacts (not shown) are formed on a lower surface of each package substrate 142. A respective solder ball (not shown) is formed on each electric contact. The solder balls are then located against the contact pads 80 on the motherboard 12 and, according to conventional methods, heated, and allowed to cool, thereby mounting the package substrate 142 to the motherboard 12. The package substrate 142 is so thermally, structurally and electrically connected to the motherboard 12.

In use, signals are transmitted through the metal lines as shown in FIG. 2 of the motherboard 12. The signals transmit through the contact pads 80, and through metal lines and vias in the package substrate 142 to the electronic circuit formed in the semiconductor die 144. Return signals are transmitted via similar paths from the electronic circuit formed in the semiconductor die 144. Metal lines in the motherboard 12 can also transmit signals from one integrated circuit formed in one semiconductor die 144 another integrated circuit formed in another semiconductor die 144.

The transmission to and from the electronic circuits in the semiconductor dies 144 results in heat being generated on the semiconductor dies 144. The heat is transferred from a respective semiconductor die 144 to the package substrate 142 of the respective semiconductor assembly 14. The heat then transfers from the respective package substrate 142 into the motherboard 12. Referring to FIG. 2, the heat transfers through the motherboard to the capillaries 64, the capillaries in the interlayer dielectric material 56, and the capillaries 44. Because the capillaries are made of thermally conductive material, the heat transfers therethrough to the cooling openings 30a, 30b, and 30c. Referring to FIG. 3, a cooling liquid is pumped by the pump 112 through the port 136 into the cavity 134. The inlets 116 of the cooling openings 30b are in flow communication with the cavity 134 and one another so that the liquid flows into the inlet openings 116 of the cooling openings 30b. The liquid then flows through a respective section 118 of a respective cooling opening 30b and leaves the motherboard 12 through a respective outlet 120 of the respective cooling opening 30b. The liquid flowing through the openings 30b then accumulates within a cavity defined by the side surface 22 and the outlet manifold 106, from where the liquid flows through a port of the manifold 106 to the radiator 110.

The pump 112 also provides liquid through a port of the inlet manifold 104 into a cavity provided between the inlet manifold 104 and the end surface 24. The liquid flows from this cavity through a respective inlet 116 of a respective opening 30a and a respective opening 30c. The liquid then flows through a respective section 118 of a respective opening 30a or 30c and leaves the motherboard 12 through a respective outlet 120 of a respective opening 30a or 30c. The liquid flowing through the openings 30a and 30c then accumulates within a cavity defined between the end surface 26 and the outlet manifold 108, from where the liquid flows through a port of the manifold 108 to the radiator 110.

Heat is transferred from the motherboard 12 to the openings 30a, 30b, and 30c is convected from inner surfaces of the capillaries to the liquid flowing through the openings 30a, 30b, and 30c. The liquid is heated while flowing through the openings 30a, 30b, and 30c and, after leaving the manifolds 106 and 108, flows through the radiator 110. Heat is transferred from the liquid by the radiator 110 so that the liquid is then cooled to a temperature which is sufficiently low to maintain the motherboard 12 at a required temperature. The liquid then flows from the radiator 110 into an inlet of the pump whereafter the liquid is again circulated.

An advantage of using a liquid as a cooling fluid is because more heat can be transferred to a liquid then to a gas. A disadvantage of using a liquid, however, is that it has to be confined and be recirculated.

Figure 4:
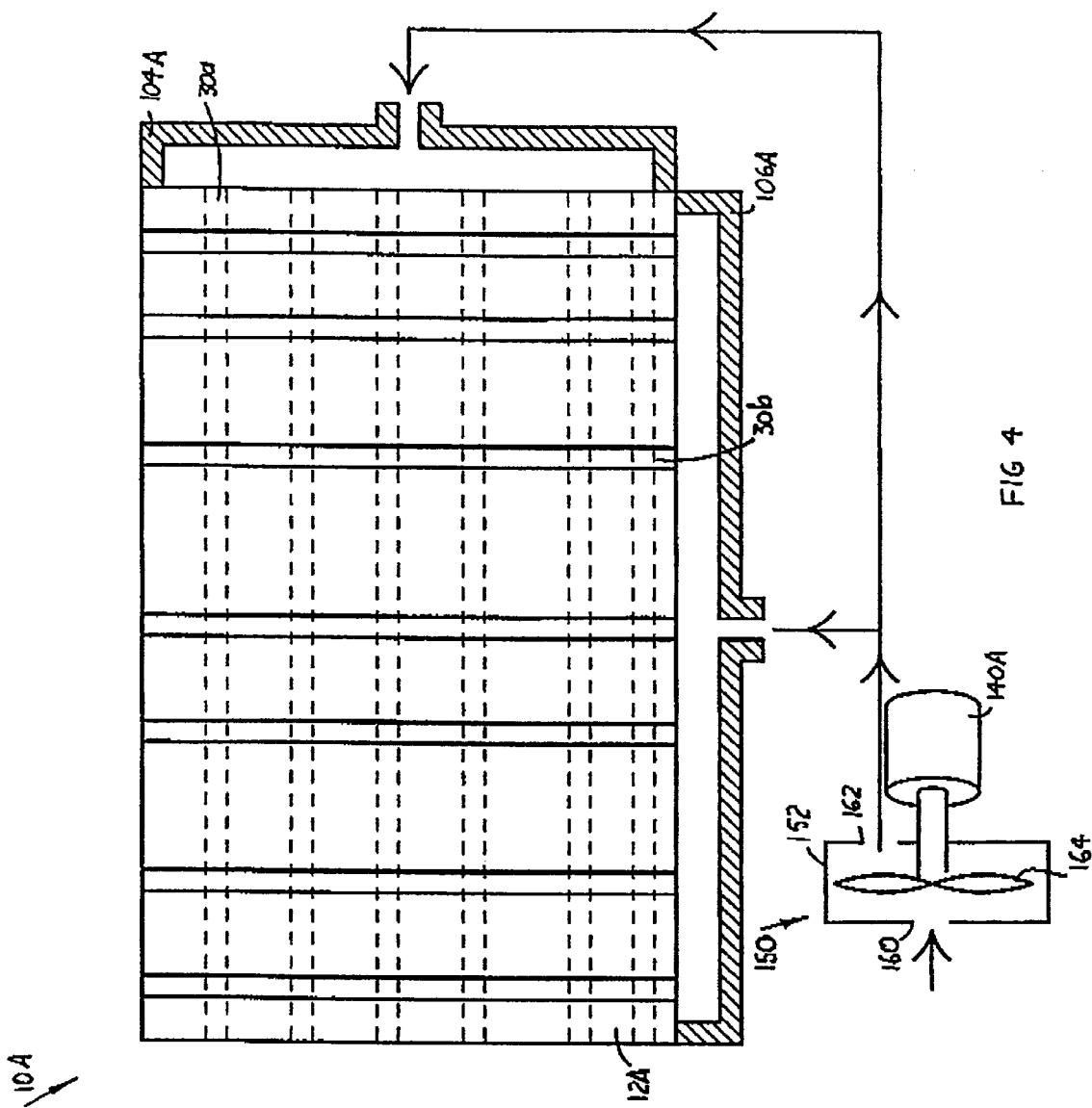
FIG. 4 is a cross-sectional plan view similar to FIG. 3 of an electronic assembly according to another embodiment of the invention.
Figure 5:
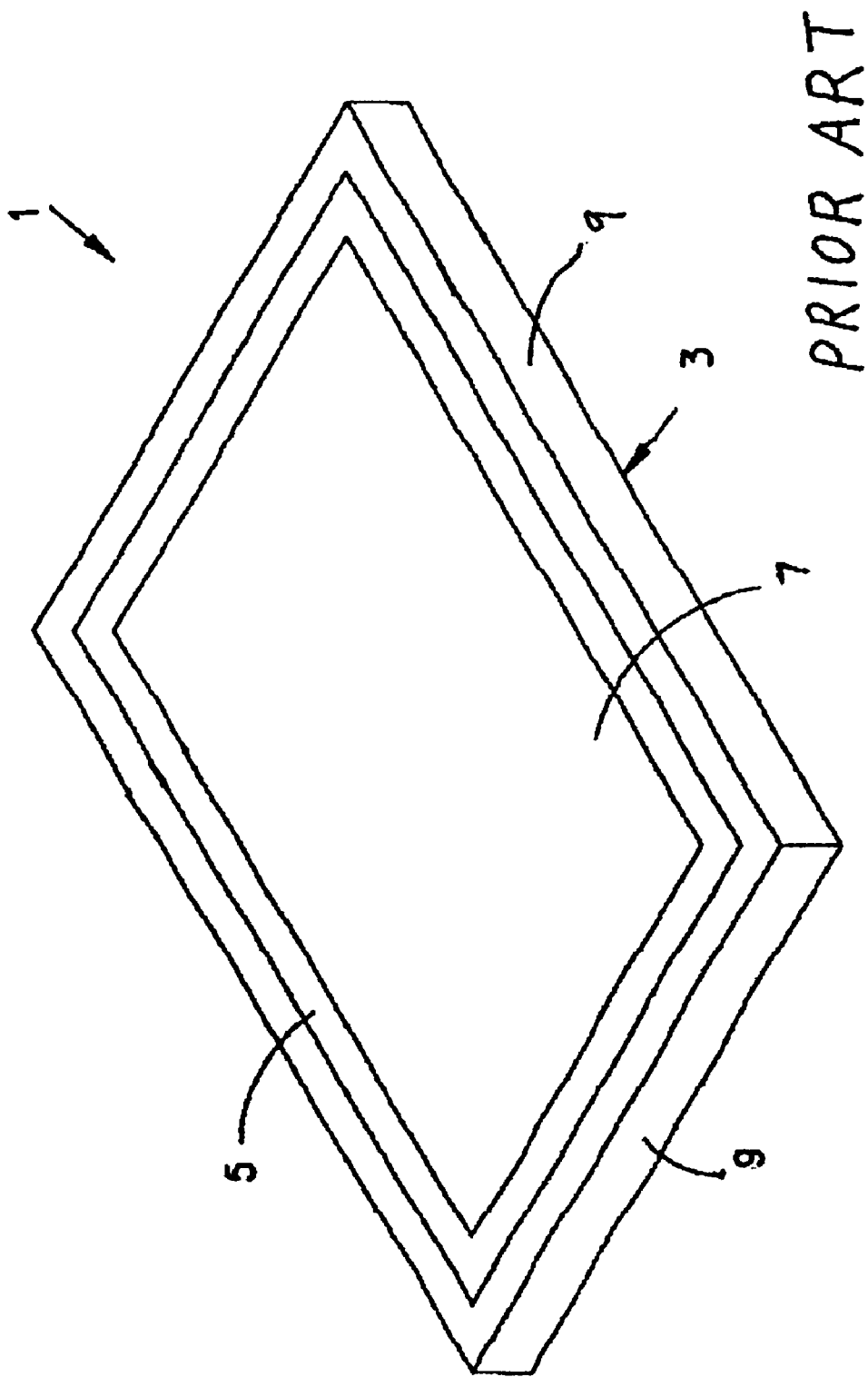
FIG. 5 is a perspective view of a die that includes a prior art guard ring structure.
Figure 6:
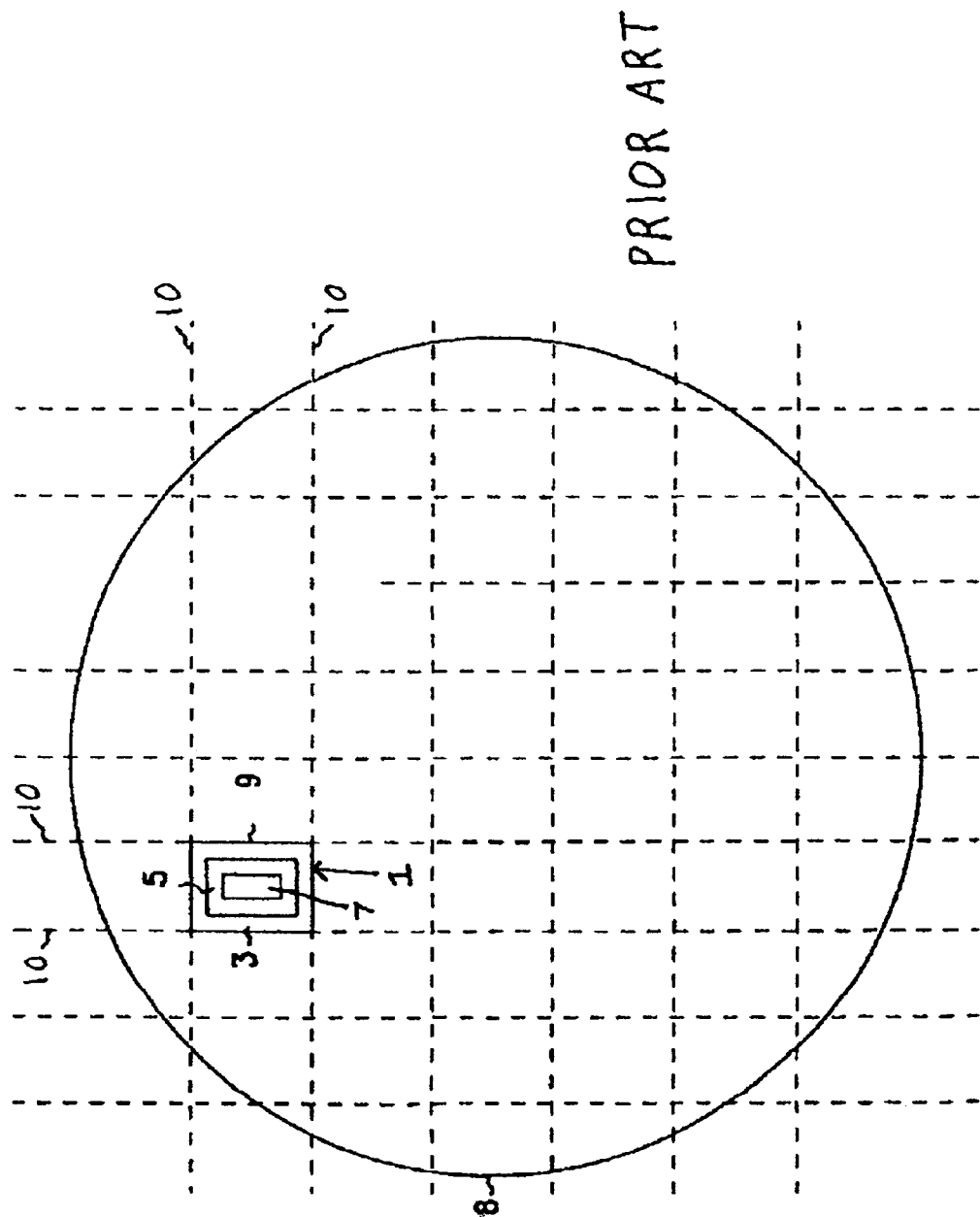
FIG. 6 is a top view of a wafer that includes the prior art die shown in FIG. 5 formed on the wafer.

FIG. 4 illustrates an electronic assembly 10a according to an alternative embodiment of the invention wherein air is used as a fluid for purposes of cooling. A fan assembly 150 is provided instead of a pump. The fan assembly 150 has a housing 152 having an inlet 160 and an outlet 162, and a fan 164 mounted in the housing 152. The fan 164 is connected to an electric motor 140a. Operation of the electric motor 140a rotates the fan 164 so that the fan 164 draws air from a surrounding atmosphere through the inlet 160 into the housing 152. The air is then expelled through the outlet 162 and flows from the outlet 162 through ports into manifolds 104a and 106a. The air then flows from within the manifolds 104a and 106a through openings 30a and 30b, whereafter the air exits the motherboard 12a into a surrounding atmosphere. The embodiment of FIG. 4 is the same as the embodiment of FIG. 3 in all other respects.

Although a fan assembly 150 is shown in FIG. 4 it should be understood that the fan assembly 150 can be replaced with another fluid actuation machine such as a compressor and the electronic assembly 10a will function in a similar manner.

It should be noted that any type of electronic substrate may be mounted to the die 144 such that signals are transmitted between the die and the electronic substrate as long as heat is extracted from the die 144 by the electronic substrate during operation of the electronic assembly 10. The electronic substrate may include an opening that extends through the electronic substrate to carry a fluid that passes through the opening to extract heat from the electronic substrate. The electronic substrate may also include a heat sink that extracts heat from the die and transfers heat from the electronic substrate.

Figure 7:
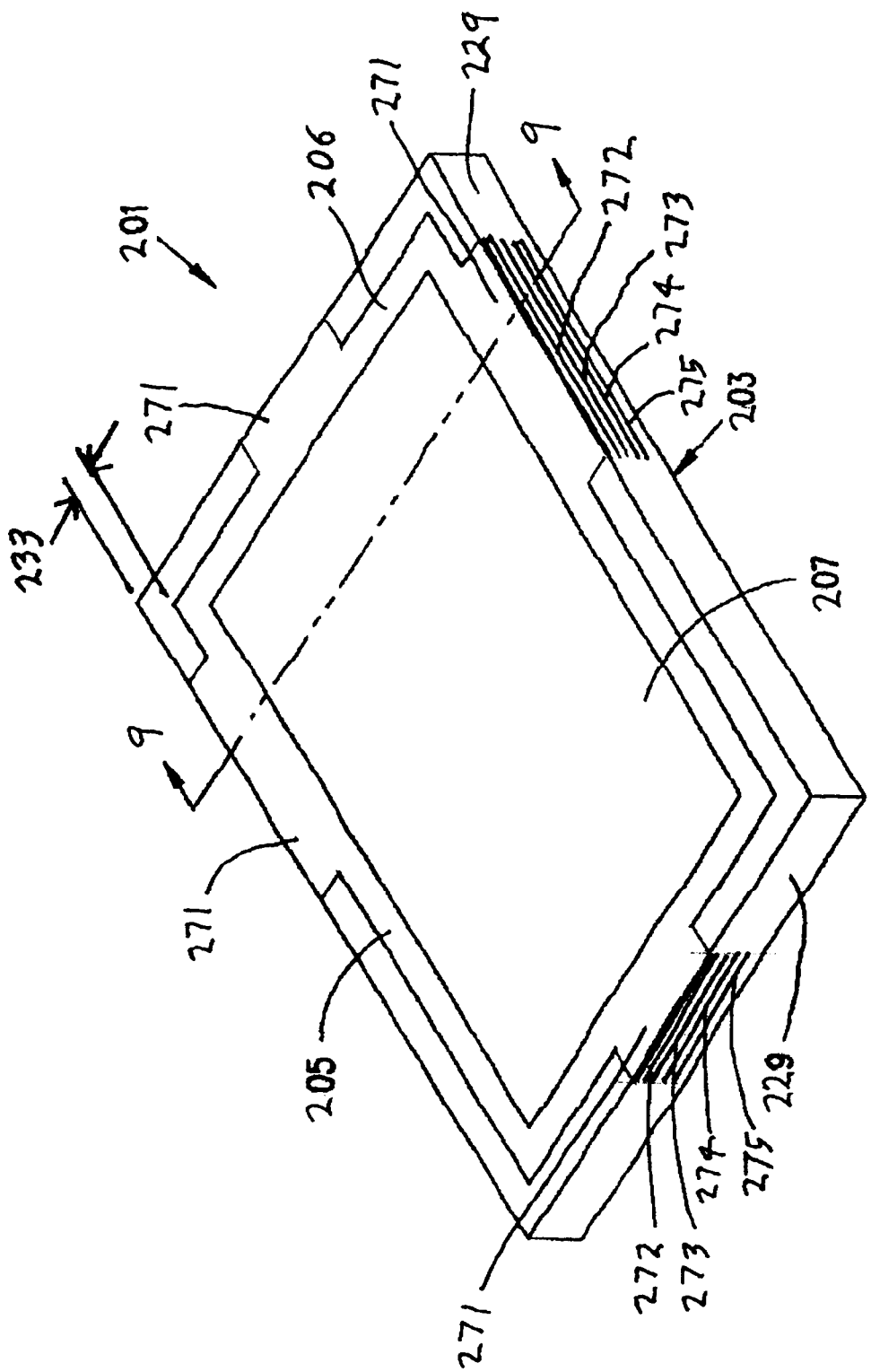
FIG. 7 is a perspective view of a die that includes a guard ring structure of the present invention.

FIG. 7 is a perspective view illustrating one embodiment of an integrated circuit 201 that encompasses the present invention. The integrated circuit 201 includes a die 203 and a guard ring structure 205. Die 203 includes a circuit area 207 and outer edges 229 such that the guard ring structure 205 surrounds circuit area 207 to separate outer edges 229 from circuit area 207. Circuit area 207 does not extend into the area of die 203 that is proximate to outer edges 229.

Integrated circuit 201 may be a processor, such as a microprocessor, or an application specific integrated circuit (ASIC), such as a circuit tailored specifically to the needs of the telecommunications industry, the automotive industry, or the aerospace industry. Integrated circuit 201 is not limited to a particular type of circuit. Analog circuits, digital circuits, and mixed-signal circuits are all suitable for use with the present invention. Integrated circuit 201 may be fabricated using a single process, such as a complementary metal-oxide semiconductor (CMOS) process or a bipolar process, or using a bipolar process and a CMOS process in combination.

Die 203 is typically fabricated from a semiconducting material, such as silicon, germanium, and gallium arsenide, with integrated circuit structures, such as active devices, passive devices, and interconnects formed in circuit area 207. Active devices used in the fabrication of integrated circuits may include diodes and transistors. Passive devices used in the fabrication of integrated circuits may include resistors and capacitors. Interconnects used in the fabrication of integrated circuit 201 include interconnects fabricated from materials such as aluminum, silver, or copper, or alloys of aluminum, silver, or copper. The interconnects are preferably embedded in a dielectric, such as an oxide, or a low-K dielectric such as xerogel.

Figure 8:
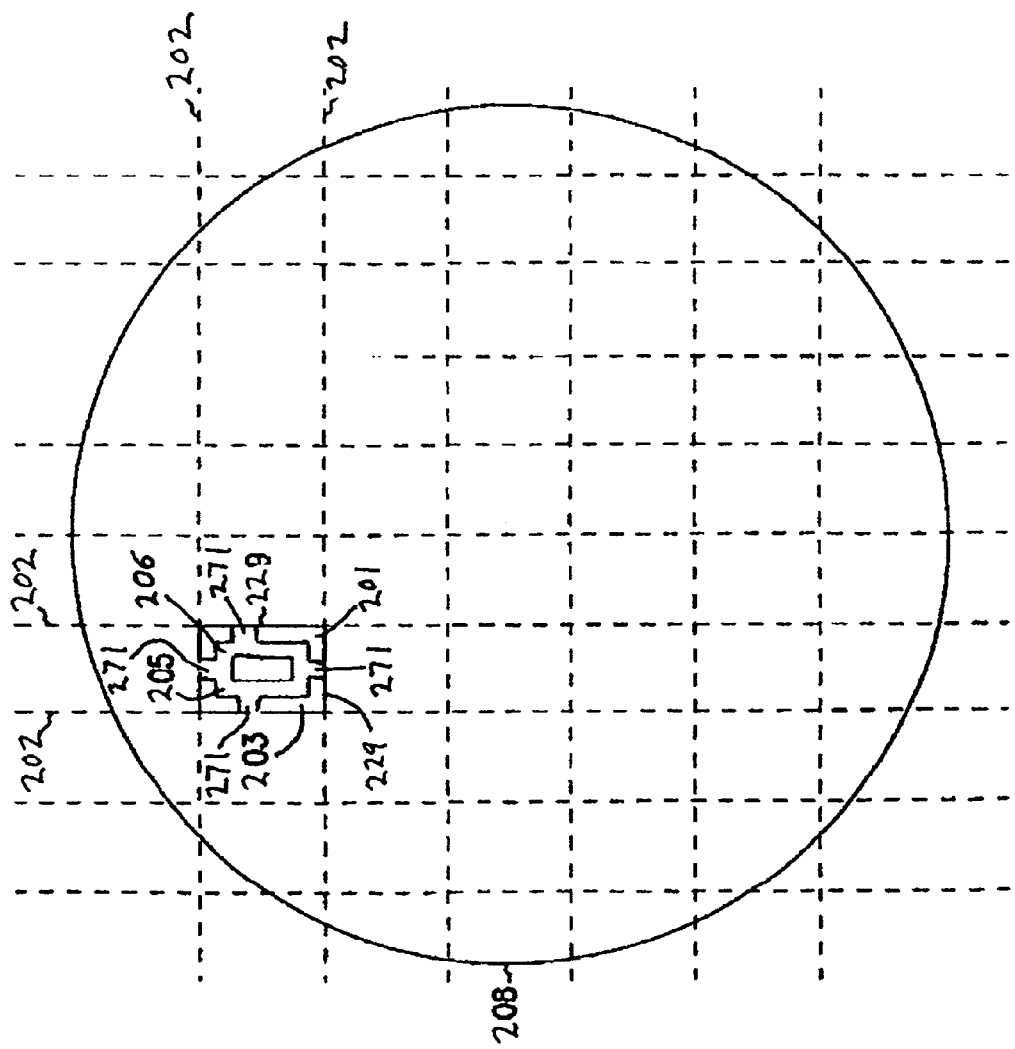
FIG. 8 is a top view of a wafer that includes the die shown in FIG. 7 formed on the wafer.

FIG. 8 is a top view of one embodiment of a wafer 208 having a die 203 formed thereon. Die 203 is fabricated by slicing wafer 208 along lines 202 into a number of pieces known as dice. Wafer 208 is sliced along outer edges 229 of die 203 to separate die 203 from wafer 208. As wafer 208 is sliced, outer edges 229 of die 203 are placed under stress that can create cracks in the outer edges 229. Guard ring structure 205 encircles circuit area 207 to prevent cracks from propagating into circuit area 207.

Figure 9:
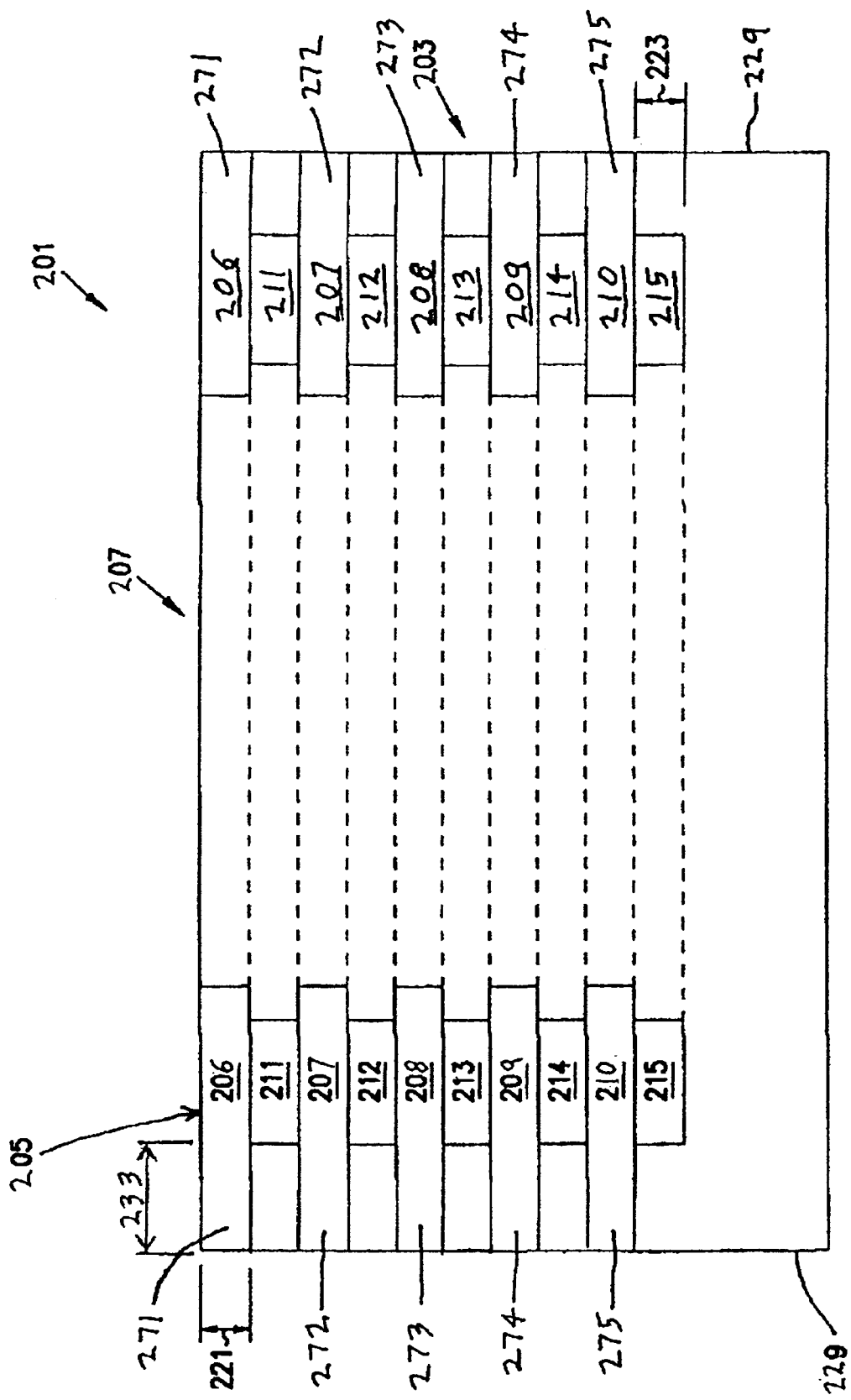
FIG. 9 is a schematic cross-sectional view taken along line 9—9 of the integrated circuit of FIG. 7.

FIG. 9 is a schematic cross-sectional view of integrated circuit 201 illustrated in FIGS. 7 and 8 taken along line 9—9 in FIG. 7. FIG. 9 is a schematic cross-sectional view illustrating one example embodiment of a guard ring structure 205 of the present invention. Guard ring structure 205 is preferably fabricated from a material having a high shear strength. The example guard ring structure 205 shown in FIG. 9 includes a plurality of individually stacked guard ring layers 206–210 and 211–215.

The individual guard ring layers 206–215 are preferably located at distance 233 of about 5 microns from the outer edges 229 of die 203. Locating the guard ring 205 at a distance of less than about 5 microns from outer edges 229 of die 203 increases the likelihood that guard ring structure 205 will be damaged during dicing of die 203. In addition, locating guard ring 205 at a distance of more than about 5 microns unnecessarily decreases the size of circuit area 207.

The plurality of individual guard ring layers 206–215 includes metal level guard ring layers 206–210, and via level guard ring layers 211–215 that alternate with the metal level guard ring layers 206–210. A metal level guard ring can be a guard ring formed on and coplanar with a metallization level of an integrated circuit. An integrated circuit may include one or more metallization levels for routing signals within the integrated circuit. A via level guard ring is a guard ring formed on and coplanar with a via level of an integrated circuit. An integrated circuit may include one or more via levels usually formed from dielectric materials and located between metallization levels. Via levels include conductive structures for interconnecting conductive structures on different metallization levels.

Although their widths are depicted as unequal in FIG. 9 for purposes of clarity, it should be noted that metal level guard ring layers 206–210 and via level guard ring layers 211–215 may have a similar, or equal, width, and be partially vertically aligned as depicted in FIG. 9. The widths of metal level guard ring layers 206–210 and via level guard ring layers 211–215 are preferably between about 20 microns and about 50 microns.

Each of the plurality of metal level guard ring layers 206–210 has a thickness 221, and each via level guard ring layer 211–215 has a thickness 223. Metal level guard ring layers 206–210 may be formed on die 203 at the same time that the metallization levels are formed in circuit area 207 such that the thickness 221 is substantially the same as the thickness of the metallization levels in circuit area 207. In addition, via level guard ring layers 211–215 may be formed on die 203 at the same time that a via level is formed in circuit area 207 such that the thickness 223 of each via level guard ring layer 211–215 is substantially the same as the thickness of the via levels in circuit area 207.

Guard ring structure 205 encircles circuit area 207 and separates circuit area 207 from the outer edges 229 of die 203 such that when a shear stress applied to outer edges 229, the stress is also applied to guard ring structure 205. The stresses may arise during the dicing of die 203 or during the thermal expansion or contraction of die 203. Guard ring structure 205 absorbs the applied stress to prevent shearing and damage to active devices, passive devices, and interconnects formed in circuit area 207.

The guard ring structure 205 of the present invention also increases the ability of die 203 to dissipate thermal energy because each of the metal level guards rings 206–210 includes respective individual projections 271–275 that extend to outer edges 229 of die 203. Each of the projections 271–275 extracts heat from circuit area 207 through a respective one of the metal level guard rings 206–210 during operation of integrated circuit 201. Each of the projections 271–275 is preferably integral with a respective one of the metal level guard rings 206–210 and made of a thermally conductive material.

It should be noted that although the projections 271–275 on each metal level guard ring 206–210 are shown as extending to each outer edge 229 of die 203, any number of projections, or different numbers of projections can extend to one or more of the outer edges 229 on die 203.

There may also be projections extending to outer edges 229 on any number of the metal level guard rings 206–210 and/or via level guard rings 211–215. In addition, a single projection may extend from one or more of the guard rings 206–215 along one of the entire outer edges 229 of die 203.

Figure 10:
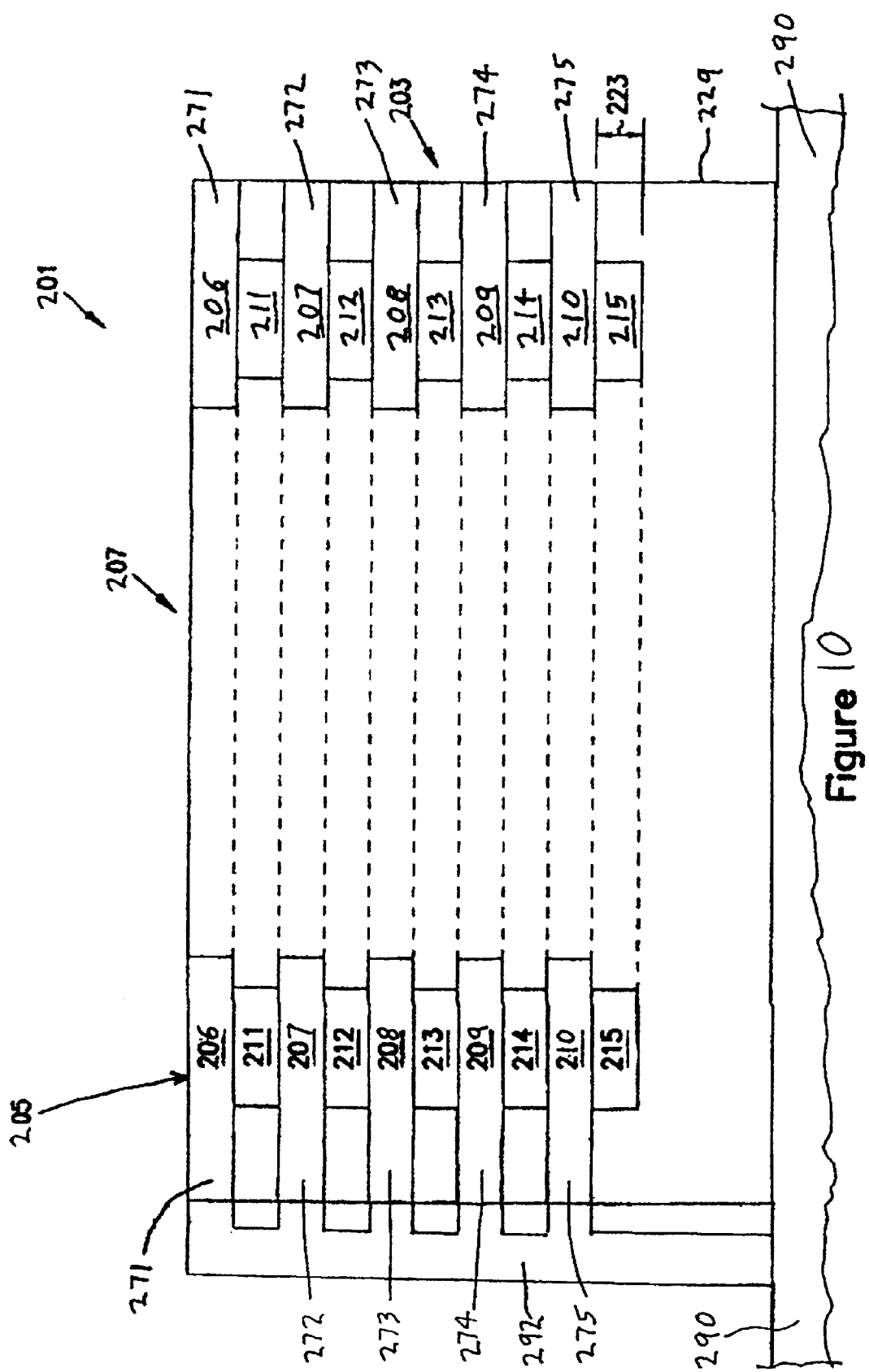
FIG. 10 is a schematic cross-sectional view similar to FIG. 9 showing the integrated circuit of FIG. 7 mounted onto a motherboard.

FIG. 10 shows an alternative embodiment of integrated circuit 201 that includes die 203 mounted to a motherboard 290. Die 203 is secured to motherboard 290 by a thermally conductive clamp 292. Motherboard 290 preferably takes any of the forms illustrated or discussed with reference to FIGS. 1–4, although it should be noted that any motherboard that performs cooling may be used. Clamp 292 provides stability to guard ring structure 205 and facilitates transferring heat from projections 271–275 on guard ring structure 205 to motherboard 290 and the surrounding environment. Clamp 292 may be connected to one, some, or all of the projections 271–275 that extend to outer edges 229 of die 203. Clamp 292 can be connected to projections 271–275 and motherboard 290 using any conventional technique, although clamp 292 is preferably connected such that there is good thermal conductivity between adjoining parts. A thermal grease may be added between any connecting joints to improve thermal conductivity between adjoining parts.

Figure 11:
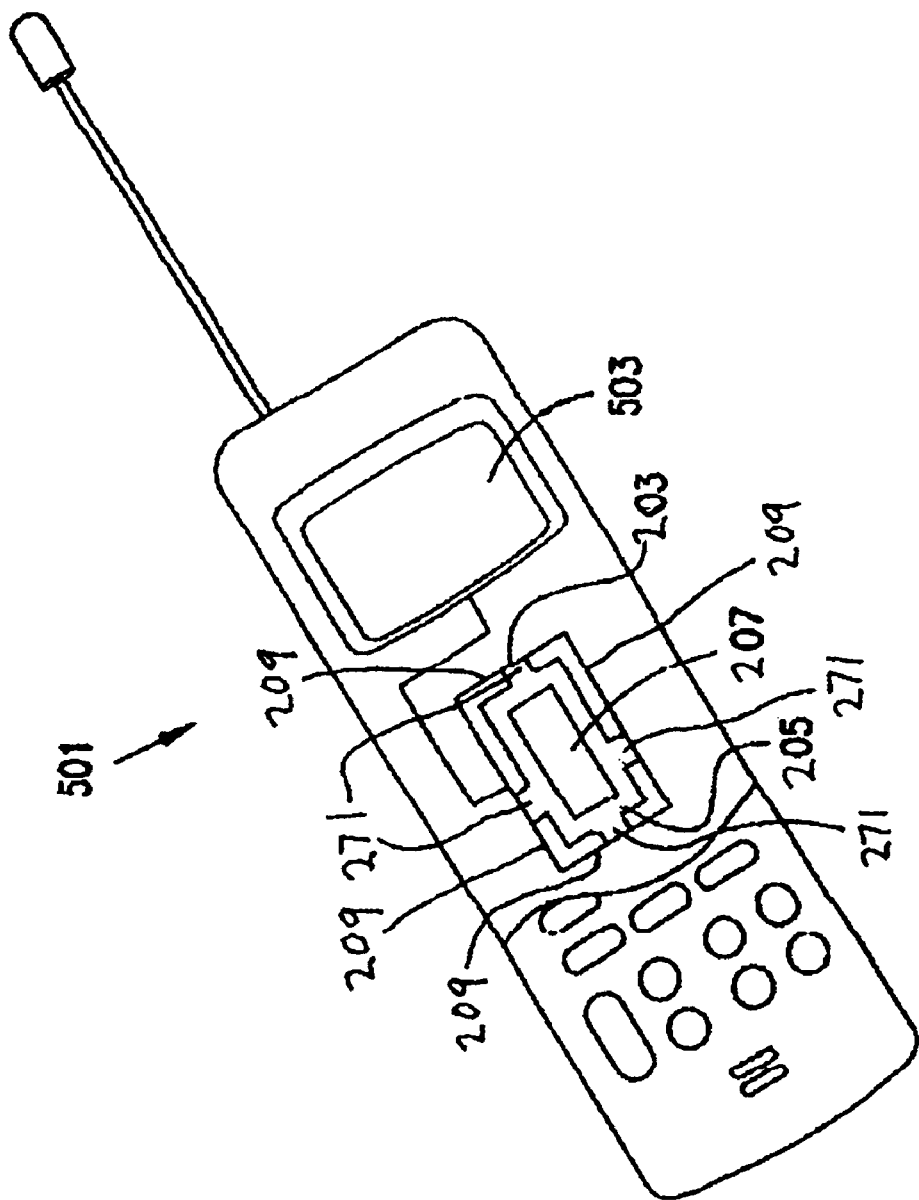
FIG. 11 is a perspective view of a computerized communication device suitable for use in connection with the present invention.

FIG. 11 is an illustration of a computer system 501 suitable for use in connection with the present invention. Computer system 501 includes die 203 having a circuit area 207 encircled by guard ring 205. Circuit area 207 includes a microprocessor coupled to a display 503. Guard ring 205 is similar to the guard 205 illustrated in FIGS. 7–9 as it includes projections 271 that extend to the outer edges 229 of die 203. Display 503 is any display capable of being coupled to a microprocessor. It should noted that computer system 501 is not limited to a particular type of computer system.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. An integrated circuit comprising:

a die having a circuit area and outer edges; and a guard ring surrounding the circuit area within the outer edges of the die, the guard ring including a projection that extends to at least one of the outer edges of the die to extract heat from the die during operation of the integrated circuit.

2. The integrated circuit of claim 1, wherein the circuit area comprises a processor.

3. The integrated circuit of claim 2, wherein the processor is at least partially formed from a low-k dielectric material.

4. The integrated circuit of claim 1, wherein the guard ring is formed at a distance of about 5 microns from the outer edge.

5. The integrated circuit of claim 1, wherein the guard ring includes a plurality of stacked guard ring layers.

6. The integrated circuit of claim 5, wherein at least one of the stacked guard ring layers includes the projection that extends to an outer edge of the die.

7. The integrated circuit of claim 6, wherein each of the individual guard ring layers includes at least one projection that extends to at least one of the outer edges on the die.

8. The integrated circuit of claim 5, wherein the plurality of stacked guard ring layers includes a plurality of metal level guard ring layers and a plurality of via level guard ring layers that are at least partially vertically aligned with the plurality of metal level guard ring layers.

9. The integrated circuit of claim 8, wherein each of the plurality of metal level guard ring layers includes a projection that extends out to at least one of the outer edges of the die.

10. The integrated circuit of claim 1, wherein the guard ring includes at least one additional projection that extends to one of the outer edges on the die.

11. The integrated circuit of claim 10, wherein the guard ring includes enough projections such that at least one projection extends to each outer edge of the die.

12. An integrated circuit comprising:

an electronic substrate;

a die mounted on the electronic substrate, the die including a circuit area and outer edges;

a guard ring encircling the circuit area, the guard ring including a projection that extends to at least one of the outer edges of the die to extract heat from the circuit area; and a clamp connecting the projection on the guard ring to the electronic substrate to extract heat from the guard ring during operation of the integrated circuit.

13. The integrated circuit of claim 12, wherein the guard ring includes a plurality of projections extending to the outer edges of the die, and the clamp connects each projection to the electronic substrate.

14. The integrated circuit of claim 12, wherein the electronic substrate includes an opening extending through the electronic substrate, the opening being capable of carrying a fluid that extracts heat from the electronic substrate.

15. The integrated circuit of claim 14, wherein the electronic substrate is a motherboard.

16. A computer system comprising:

a die including a processor and outer edges;

a guard ring surrounding the processor within the outer edges of the die, the guard ring including a projection that extends to at least one of the outer edges of the die to extract heat from the processor during operation of the computer system; and a display coupled to the processor.

17. The computer system of claim 16, wherein the guard ring includes a plurality of stacked guard rings.

18. The computer system of claim 16, wherein the guard ring includes at least one additional projection that extends to one of the outer edges on the die.

* * * * *